(12) United States Patent
Imahori et al.

(10) Patent No.: US 11,378,417 B2
(45) Date of Patent: Jul. 5, 2022

(54) ROTATION DETECTION DEVICE

(71) Applicant: Hitachi Metals, Ltd., Tokyo (JP)

(72) Inventors: Masaaki Imahori, Tokyo (JP);
Kazuhiko Tomita, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 87 days.

(21) Appl. No.: 16/834,296

(22) Filed: Mar. 30, 2020

(65) Prior Publication Data

US 2020/0318995 A1 Oct. 8, 2020

(30) Foreign Application Priority Data

Apr. 2, 2019 (JP) .............................. JP2019-070388
Feb. 21, 2020 (JP) .............................. JP2020-028019

(51) Int. Cl.
| | | |
|---|---|---|
| *G01D 5/14* | (2006.01) | |
| *G01P 1/02* | (2006.01) | |
| *G01P 3/48* | (2006.01) | |
| *G01R 33/07* | (2006.01) | |
| *G01P 3/488* | (2006.01) | |
| *G01P 3/487* | (2006.01) | |

(52) U.S. Cl.
CPC .............. *G01D 5/142* (2013.01); *G01P 1/026* (2013.01); *G01P 3/487* (2013.01); *G01P 3/488* (2013.01); *G01R 33/07* (2013.01)

(58) Field of Classification Search
CPC .......... G01D 5/142; G01P 1/026; G01P 3/487
See application file for complete search history.

(56) References Cited

U.S. PATENT DOCUMENTS

| | | | | |
|---|---|---|---|---|
| 8,132,967 | B2 * | 3/2012 | Shigeoka | .............. F16C 19/186 384/448 |
| 10,101,412 | B2 * | 10/2018 | Ikeda | ................... G01D 11/245 |
| 10,509,050 | B2 | 12/2019 | Welsch et al. | |
| 2017/0184418 | A1 * | 6/2017 | Ikeda | ................... G01D 11/245 |

(Continued)

FOREIGN PATENT DOCUMENTS

| | | |
|---|---|---|
| JP | 2017-227560 A | 12/2017 |
| JP | 2018-505417 A | 2/2018 |

OTHER PUBLICATIONS

Notification of Reasons for Refusal dated Apr. 9, 2020 received from the Japanese Patent Office in related application 2020-028019 together with English language translation.

*Primary Examiner* — Reena Aurora

(74) *Attorney, Agent, or Firm* — Scully, Scott, Murphy & Presser, PC

(57) ABSTRACT

A rotation detecting device includes a member to be detected, and a sensor section arranged opposite the member to be detected. The sensor section includes two magnetic sensors, each including a detecting portion to detect a magnetic field produced from the member to be detected, with the detecting portions of the sensors being arranged in such a manner as to overlap each other in an opposite arrangement direction of the sensor section and the member to be detected, and a housing provided to cover the sensors together, and including an opposite surface to the member to be detected. The detecting portion of one of the sensors, which is arranged in a side of the sensor section close to the member to be detected, is arranged in such a manner as to be inclined with respect to the opposite surface of the housing.

8 Claims, 4 Drawing Sheets

(56) References Cited

U.S. PATENT DOCUMENTS

2018/0024156 A1   1/2018   Welsch et al.
2019/0094044 A1   3/2019   Onimoto et al.
2019/0368896 A1*  12/2019  Tomita .................. G01D 5/145

* cited by examiner

ROTATION DETECTION DEVICE

CROSS-REFERENCE TO RELATED APPLICATIONS

The present invention is based on Japanese Patent Application No. 2019-070388 filed on Apr. 2, 2019 and Japanese Patent Application No. 2020-028019 filed on Feb. 21, 2020, the entire contents of which are incorporated herein by reference.

BACKGROUND OF THE INVENTION

1. Field of the Invention

The present invention relates to a rotation detecting device.

2. Description of the Related Art

Conventionally, there is known a rotation detecting device which is designed to be used, for example, in a wheel bearing unit, to detect the rotational speed of a rotatable member which is designed to be rotated together with a wheel. The rotation detecting device detects the rotation speed of the rotatable member by detecting a change in a magnetic field produced by a magnet (referred to as a member to be detected) fitted to the rotatable member, with a magnetic sensor provided in a sensor section.

JP-A-2018-505417 discloses a rotation detecting device equipped with two built-in magnetic sensors in a sensor section so as to provide a redundancy. Both the magnetic sensors are being covered with a housing portion made of a resin mold, so that the occurrence of water ingress or the like from outside is suppressed by that housing portion.

[Patent Document 1] JP-A-2018-505417

SUMMARY OF THE INVENTION

Now, in order to enhance the detection sensitivity in the rotation detecting device, bringing the magnetic sensors as close to the member to be detected as possible is desired. Since there is a limit on bringing the sensor section close to the member to be detected, arranging the magnetic sensors in a location as close to a surface of the housing portion (an opposite surface of the housing portion to the member to be detected) in the sensor section as possible is desired.

However, when the magnetic sensors are arranged in a location close to the surface of the housing portion, since the spacing between a mold used in resin molding and the magnetic sensors becomes narrow, during the resin molding, the resin may not be passed into the space between the mold and the magnetic sensors, which may lead to the occurrence of a poor molding, and the occurrence of a failure such as the occurrence of a part of the magnetic sensors being exposed from the housing portion, or the like.

In view of the foregoing, an object of the present invention is to provide a rotation detecting device that is designed to be able to enhance its detection sensitivity, and be resistant to the occurrence of a poor molding during resin molding of a housing portion.

For the purpose of solving the above problems, the present invention provides a rotation detecting device, comprising: a member to be detected being configured to be fitted to a rotatable member, and being provided with a plurality of magnetic poles along a circumferential direction centered on a rotation axis of the rotatable member; and a sensor section being configured to be fitted to a fixed member that is not rotated by rotation of the rotatable member, and being arranged opposite the member to be detected, wherein the sensor section includes: two magnetic sensors, each including a plate shape detecting portion including a magnetic detection element, which is configured to detect a magnetic field produced from the member to be detected, and a connection terminal, which is extended out from the detecting portion, with the detecting portions of the two magnetic sensors being arranged in such a manner as to overlap each other in an opposite arrangement direction of the sensor section and the member to be detected; and a housing portion being made of a resin mold provided in such a manner as to cover the two magnetic sensors together, and including an opposite surface to the member to be detected, wherein the two magnetic sensors include a first magnetic sensor, which is arranged in a side of the sensor section close to the member to be detected, with the detecting portion of the first magnetic sensor being arranged in such a manner as to be inclined with respect to the opposite surface of the housing portion to the member to be detected.

Points of the Invention

According to the present invention, it is possible to provide the rotation detecting device that is designed to be able to enhance its detection sensitivity, and be resistant to the occurrence of a poor molding during the resin molding of the housing portion.

DETAILED DESCRIPTION OF THE PREFERRED EMBODIMENTS

Embodiment

An embodiment of the present invention will be described below in conjunction with the accompanying drawings.

(Configuration of a Wheel Bearing Device 10)

Figure 1:
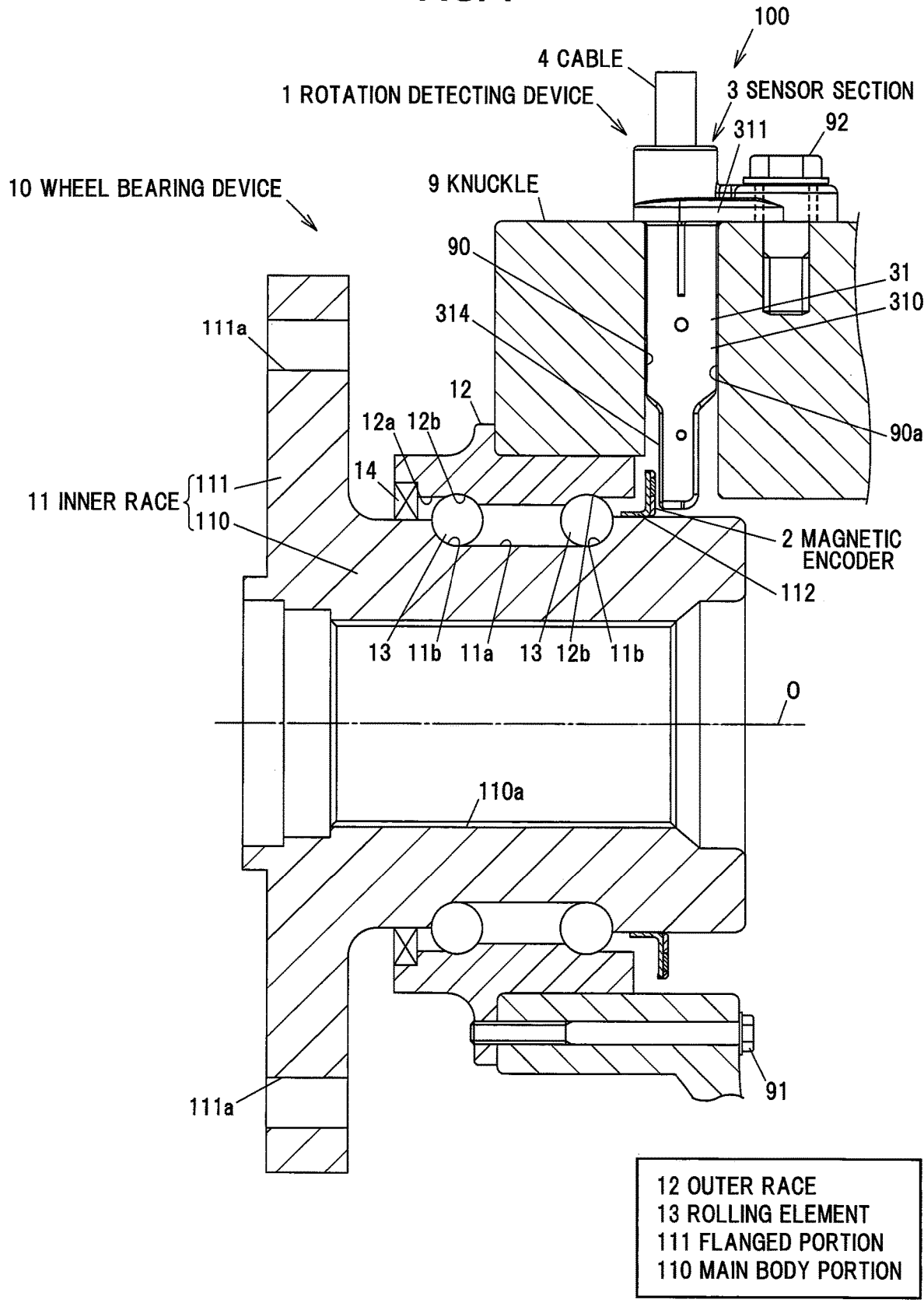
FIG. 1 is a cross-sectional view showing a configuration example of a rotation detecting device according to one embodiment of the present invention, and a vehicle wheel bearing device having that rotation detecting device.

FIG. 1 is a cross-sectional view showing a configuration example of a rotation detecting device 1 according to the present embodiment and a vehicle wheel bearing device 10 having that rotation detecting device 1.

The wheel bearing device 10 is configured to include an inner race 11 as a rotatable member including a circular cylindrical shape main body portion 110, and a flanged portion 111, which is designed to be fitted with a wheel, an outer race 12, which is arranged around an outer peripheral side of the main body portion 110 of the inner race 11, a plurality of spherical shape rolling elements 13, which are being arranged between one pair of raceway surfaces 11b and 11b formed on an outer peripheral surface 11a of the inner race 11 and one pair of raceway surfaces 12b and 12b formed on an inner peripheral surface 12a of the outer race 12, and which are being designed to be rolled on both the one pair of raceway surfaces 11b and 11b and the one pair of raceway surfaces 12b and 12b, and a rotation detecting device 1, which is designed to detect a rotation velocity (in other words, wheel speed) of the inner race 11 relative to the outer race 12.

In the wheel bearing device 10, a central portion of the main body portion 110 of the inner race 11 is formed with a through hole along its rotation axis line O, and an inner surface of that through hole is formed with a spline mating portion 110a, which is designed to couple a drive shaft (not shown). Further, the one pair of raceway surfaces 11b and 11b of the inner race 11 are being formed parallel to each other in such a manner as to extend in a circumferential direction centered on the rotation axis line O of the main body portion 110 of the inner race 11.

The flanged portion 111 of the inner race 11 is provided integrally with the main body portion 110 thereof in such a manner as to protrude outward in radial directions of the main body portion 110. The flanged portion 111 of the inner race 11 is formed with a plurality of through holes 111a into which bolts respectively for fitting a wheel not shown are press fitted.

The outer race 12 is formed in a circular cylindrical shape, and is fixed to a knuckle 9, which is coupled to a vehicle body, with a plurality of bolts 91 (in FIG. 1, only one bolt thereof shown). The knuckle 9 is shown as one example of a fixed member that is designed to rotatably support the inner race 11. The one pair of raceway surfaces 12b and 12b of the outer race 12 are being formed parallel to each other in such a manner as to extend in the circumferential direction of the inner race 11 in opposition to the one pair of raceway surfaces 11b and 11b, respectively, of the inner race 11. An end portion of the outer race 12, which is located at a flanged portion 111 side of the inner race 11, is provided with a seal 14 thereon, which is arranged between that end portion of the outer race 12 and the main body portion 110 of the inner race 11.

The knuckle 9 is formed with a holding hole 90, which is designed to hold a sensor section 3 of the rotation detecting device 1, which will be described next. The holding hole 90 of the knuckle 9 is of a circular shape in cross section at right angles to its central axis, and is passing through the knuckle 9 in the radial directions of the inner race 11.

(Description of the Rotation Detecting Device 1)

Figure 2:
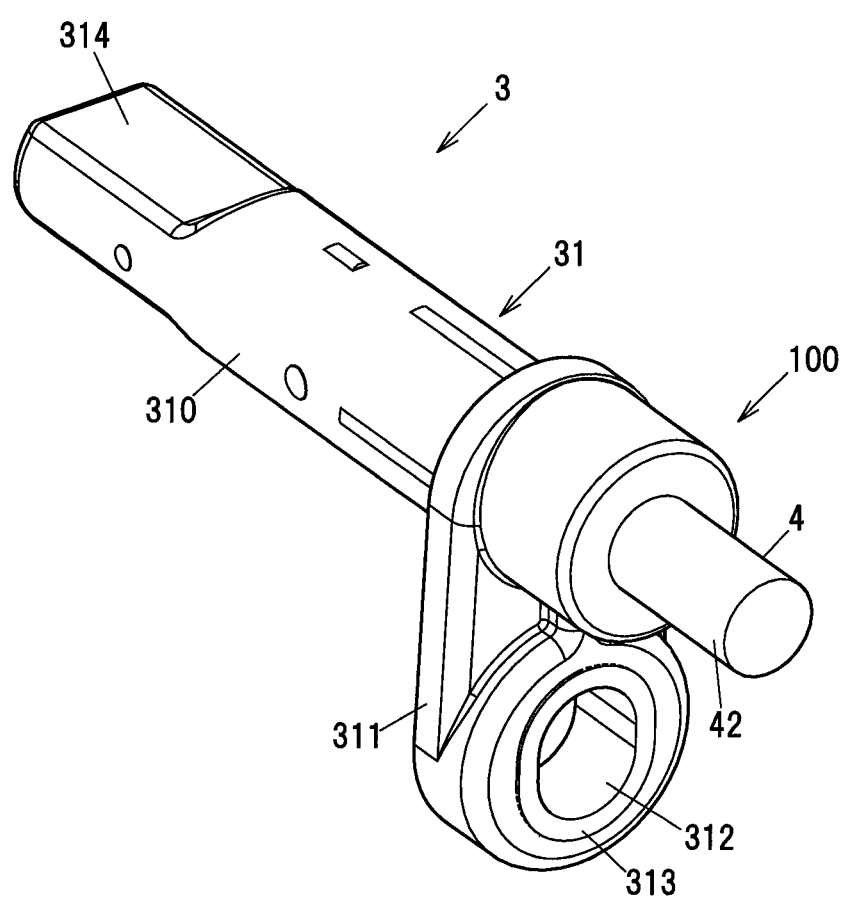
FIG. 2 is a perspective view showing a sensor section.
Figure 3A:
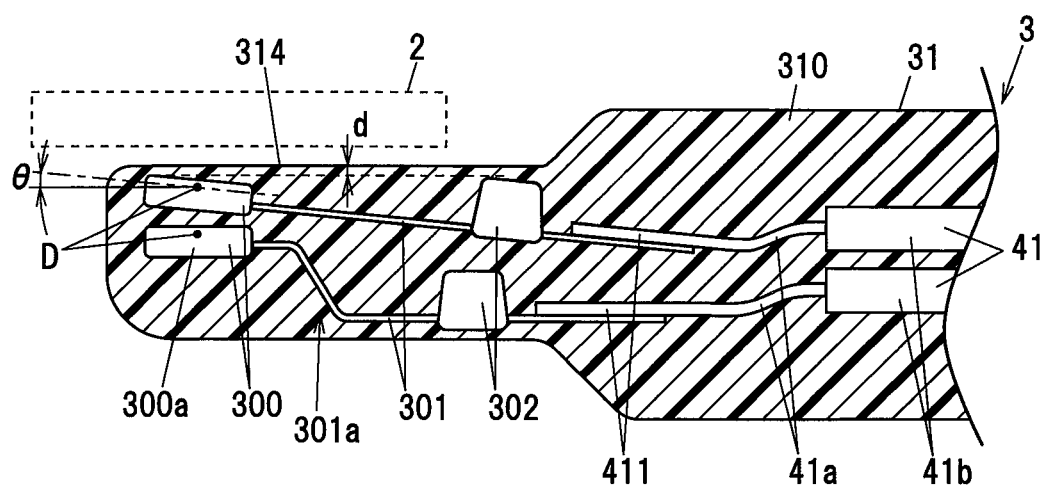
FIG. 3A is a cutaway view showing the sensor section.
Figure 3B:
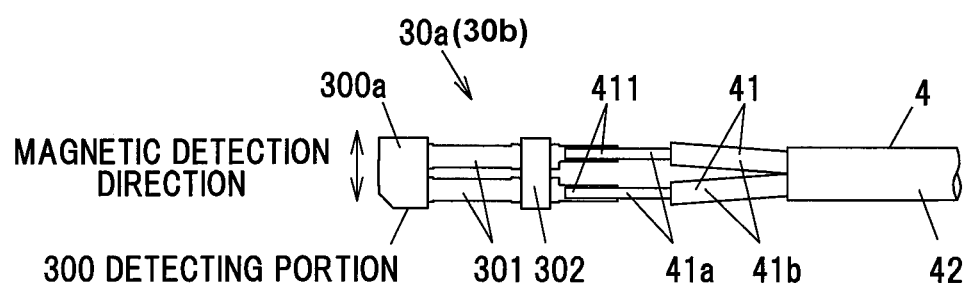
FIG. 3B is a plan view showing a first magnetic sensor and a pair of electric wires.

FIG. 2 is a perspective view showing the sensor section 3. FIG. 3A is a cutaway view of the sensor section 3, and FIG. 3B is a plan view showing a first magnetic sensor 30a and one pair of electric wires 41.

As shown in FIGS. 1, 2, 3A and 3B, the rotation detecting device 1 is designed to be fitted to the inner race 11 of the wheel bearing device 10 being designed as the rotatable member. The rotation detecting device 1 is configured to include a magnetic encoder 2 as a member to be detected, which is provided with a plurality of magnetic poles (not shown) along the circumferential direction centered on the rotation axis (the rotation axis line O) of the inner race 11 of the wheel bearing device 10, and the sensor section 3, which is designed to be fitted to the knuckle 9 of the wheel bearing device 10 being designed as the fixed member that is not rotated by rotation of the inner race 11 of the wheel bearing device 10, and which is arranged opposite the aforementioned magnetic encoder 2 in the rotation detecting device 1.

In the rotation detecting device 1, the magnetic encoder 2 is formed in a circular ring shape having a thickness in the direction parallel to the rotation axis line O of the inner race 11 of the wheel bearing device 10. The magnetic encoder 2 is supported by a supporting member 112 that is fixed to the outer peripheral surface 11a of the inner race 11, so the magnetic encoder 2 is fitted to the inner race 11 in such a manner as to be rotated integrally with the inner race 11. Further, the magnetic encoder 2 has the N magnetic poles and the S magnetic poles, that are being arrayed alternately along the circumferential direction of the inner race 11 in opposition to the sensor section 3 of the rotation detecting device 1.

The sensor section 3 is provided at one end portion of a cable 4. The cable 4 provided with the sensor section 3 at the one end portion of the cable 4 is the cable with the sensor denoted by numeral 100. In the present embodiment, in the rotation detecting device 1, the magnetic encoder 2 and a side surface (an opposite surface 314 which will be described later) of a front end portion of the sensor section 3 are being arranged opposite each other in the axial direction parallel to the rotation axis line O of the inner race 11 of the wheel bearing device 10.

The cable 4 is configured to include two pairs of electric wires 41 and 41, and 41 and 41 in correspondence with two magnetic sensors 30 and 30 respectively of the sensor section 3. Each of the electric wires 41 is configured to include a central conductor 41a, which is made of a stranded conductor composed of highly electrically conductive wires such as copper wires or the like laid together, and a electrical insulating member 41b, which is provided over an outer periphery of that respective central conductor 41a, and which is made of an electrically insulative resin such as a cross-linked polyethylene or the like. In addition, the cable 4 is configured to further include a sheath 42 that is provided to cover the two pairs (four) of the electric wires 41 and 41, and 41 and 41 together.

At the one end portion of the cable 4, the two pairs of the electric wires 41 and 41, and 41 and 41 thereof are exposed from the sheath 42, and further, at the respective one end portions of the two pairs of the electric wires 41 and 41, and 41 and 41, the respective central conductors 41a of the electric wires 41 are exposed from the respective electrical insulating members 41b of the electric wires 41. The central conductors 41a exposed from the electrical insulating members 41b of the two pairs of the electric wires 41 and 41, and 41 and 41 are electrically connected by welding to respective one pairs of connection terminals 301 and 301, and 301 and 301 of the corresponding two magnetic sensors 30 and 30 respectively. In the present embodiment, the central conductors 41a and 41a, and 41a and 41a of the two pairs of the electric wires 41 and 41, and 41 and 41 and the respective one pairs of connection terminals 301 and 301, and 301 and 301 of the corresponding two magnetic sensors 30 and 30 are connected to each other respectively by joining (coupling) together of the constituent laid wires of each of the respective constituent central conductors 41a of the two pairs of the electric wires 41 to form respective one end portions of the respective constituent central conductors 41a of the two pairs of the electric wires 41 into linear shape joint portions 411 respectively, and subsequent resistance welding of those linear shape joint portions 411 and 411, and 411 and 411 to respective one end portions of the respective one pairs of connection terminals 301 and 301, and 301 and 301 of the corresponding two magnetic sensors 30 and 30 respectively.

In the rotation detecting device 1 according to the present embodiment, the sensor section 3 is configured to include the two magnetic sensors 30 and 30, and a housing portion 31, which is made of a resin mold, and which is provided in such a manner as to cover those two magnetic sensors 30 and 30 together.

The two magnetic sensors 30 and 30 are each being configured to include a plate shape detecting portion 300, which is configured to include a magnetic detection element (not shown), which is configured to detect a magnetic field produced from the magnetic encoder 2, and their respective one pair of connection terminals 301 and 301, which are being extended out from the detecting portion 300. In the present embodiment, the magnetic detection elements included in the respective detecting portions 300 and 300 of the two magnetic sensors 30 and 30 are made of a GMR (Giant Magneto Resistive effect) element. Note that, as the magnetic detection elements included in the respective detecting portions 300 and 300 of the two magnetic sensors 30 and 30, an AMR (Anisotropic Magneto Resistive) element, a TMR (Tunneling Magneto Resistive) element, a Hall element, or the like can also be used.

The respective detecting portions 300 and 300 of the two magnetic sensors 30 and 30 are each being configured to include the magnetic detection element, which is configured to detect a magnetic field produced from the magnetic encoder 2, a signal processing circuit (not shown), which is configured to process a signal output from that respective magnetic detection element, and a resin mold 300*a* as a covering member, which is configured to cover that respective magnetic detection element and that respective signal processing circuit together. The respective detecting portions 300 and 300 of the two magnetic sensors 30 and 30 are being formed in a substantially rectangular plate shape (a rectangular plate shape with one of four corner portions thereof being chamfered) in plan view.

In each of the two magnetic sensors 30 and 30, their respective one pair of connection terminals 301 and 301 is extended out from one long side of their respective substantially rectangular plate shape detecting portion 300 (one long side being not joined to the chamfered one corner portion of the substantially rectangular plate shape detecting portion 300) and in a direction perpendicular to that one long side, and those respective two connection terminals 301 and 301 are being formed parallel to each other. In the present embodiment, in each of the two magnetic sensors 30 and 30, their respective two connection terminals 301 and 301 are being formed in a strip shape (a long narrow plate shape), and their respective two tip portions (their respective opposite end portions to the detecting portion 300) are electrically connected to the central conductors 41*a* and 41*a* (the joint portions 411 and 411) of the corresponding two electric wires 41 and 41 respectively.

In each of the two magnetic sensors 30 and 30, a capacitive element (not shown), which is designed for noise suppression, is connected between their respective two connection terminals 301 and 301, and a capacitive element protecting portion 302, which is formed by resin molding, is provided in such a manner as to cover that respective capacitive element and those respective two connection terminals 301 and 301 being connected to that respective capacitive element.

In the sensor section 3, the two magnetic sensors 30 and 30 are being arranged in such a manner that their respective detecting portions 300 and 300 overlap each other in an opposite arrangement direction of the sensor section 3 and the magnetic encoder 2. Herein, of the two magnetic sensors 30 and 30 in the sensor section 3, one magnetic sensor 30 arranged in a side of the sensor section 3 close to the encoder 2 will be referred to as the first magnetic sensor 30*a*, while the other magnetic sensor 30 arranged in a side of the sensor section 3 away from the magnetic encoder 2 will be referred to as the second magnetic sensor 30*b*. Details of the arrangement of the two magnetic sensors 30*a* and 30*b* of the sensor section 3, and the like will be described later.

The housing portion 31 of the sensor section 3 is made by integrally forming a main body portion 310, that is configured to cover the two magnetic sensors 30 and 30 of the sensor section 3 and the one end portion of the cable 4 together, and a flanged portion 311, that is configured to fix the sensor section 3 of the rotation detecting device 1 to the knuckle 9 of the wheel bearing device 10. The flanged portion 311 is formed with a bolt hole 312, that is designed to pass therethrough a bolt 92 (see FIG. 1), that is designed to fix the sensor section 3 of the rotation detecting device 1 to the knuckle 9 of the wheel bearing device 10, while the bolt hole 312 is provided with a collar 313, along an inner peripheral surface of that bolt hole 312, which is made of a metal to suppress the occurrence of deformation of the flanged portion 311 when the sensor section 3 of the rotation detecting device 1 is fixed to the knuckle 9 of the wheel bearing device 10 with the bolt 92.

A side surface of one end portion of the main body portion 310 of the housing portion 31 (an opposite end portion of the main body portion 310 of the housing portion 31 to a side thereof from which the cable 4 is extended out) is formed as a flat opposite surface 314 of the housing portion 31, which is oriented opposite the magnetic encoder 2, and which is referred to as the opposite surface 314 of the housing portion 31 to the magnetic encoder 2). The sensor section 3 of the rotation detecting device 1 is fixed to the knuckle 9 of the wheel bearing device 10, with the opposite surface 314 of the housing portion 31 being oriented opposite the magnetic encoder 2 (with the opposite surface 314 of the housing portion 31 being oriented opposite the magnetic encoder 2 in the axial direction parallel to the rotation axis line O of the inner race 11 of the wheel bearing device 10).

As the resin to be able to be used in the housing portion 31, it is possible to use, e.g., PA (polyamide) 612, nylon 66 (the nylon is a registered trademark), PBT (polybutylene terephthalate), or the like. Further, as the resin to be able to be used in the housing portion 31, a resin obtained by mixing a glass filler into the above resins can also be used.

(Arrangement of the First Magnetic Sensor 30*a* and the Second Magnetic Sensor 30*b*, etc.)

In the rotation detecting device 1 according to the present embodiment, the detecting portion 300 of the first magnetic sensor 30*a* being arranged in the side of the sensor section 3 close to the encoder 2 is arranged in such a manner as to be inclined with respect to the opposite surface 314 of the housing portion 31 to the magnetic encoder 2. The first magnetic sensor 30*a* is arranged in such a manner that the direction of the short sides of the substantially rectangular plate shape detecting portion 300 (the extending out direction of the two connection terminals 301 and 301) of the first magnetic sensor 30*a* is inclined with respect to the opposite surface 314 of the housing portion 31 to the magnetic encoder 2. The direction of the long sides of the substantially rectangular plate shape detecting portion 300 of the first magnetic sensor 30*a* is configured to be parallel to the opposite surface 314 of the housing portion 31 to the magnetic encoder 2. Further, the detecting portion 300 of the first magnetic sensor 30*a* is arranged in such a manner as to be increased in distance from the opposite surface 314 of the housing portion 31 to the magnetic encoder 2, and toward a side from which the two connection terminals 301 and 301 of the first magnetic sensor 30*a* is extended out.

By arranging the detecting portion 300 of the first magnetic sensor 30*a* in such a manner as to be inclined with respect to the opposite surface 314 of the housing portion 31 to the magnetic encoder 2, it is possible to bring a sensing portion D of the magnetic detection element included in the detecting portion 300 of the first magnetic sensor 30a closer to the opposite surface 314 of the housing portion 31 to the magnetic encoder 2, and therefore make the spacing between the sensing portion D of the magnetic detection element included in the detecting portion 300 of the first magnetic sensor 30a and the magnetic encoder 2 smaller to thereby be able to enhance the detection sensitivity of the magnetic detection element included in the detecting portion 300 of the first magnetic sensor 30a.

Figure 4:
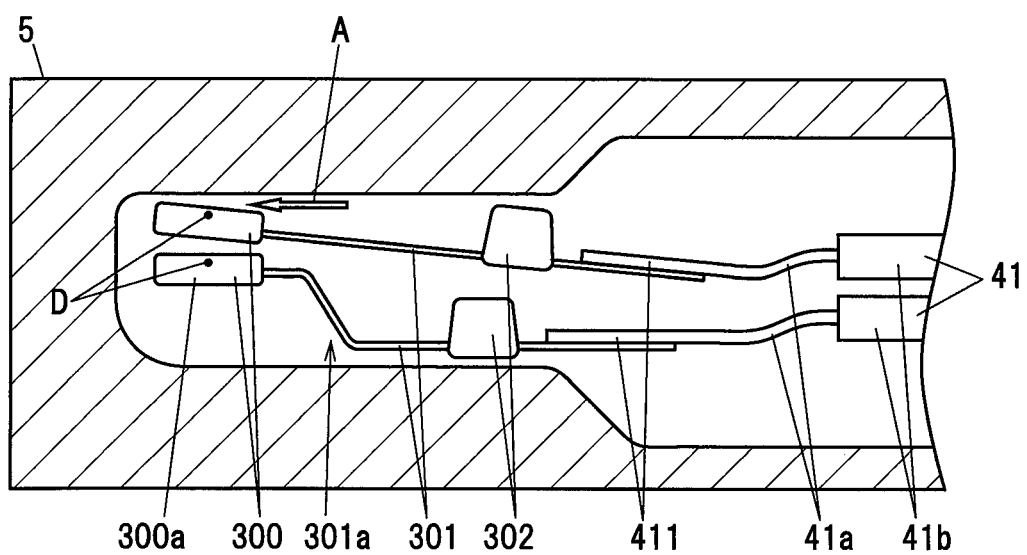
FIG. 4 is an explanatory diagram for explaining a flow of a resin during resin molding.

Further, by arranging the detecting portion 300 of the first magnetic sensor 30a in such a manner as to be inclined with respect to the opposite surface 314 of the housing portion 31 to the magnetic encoder 2, during the resin molding of the housing portion 31, the resin is easily passed into the space between the mold and the detecting portion 300 of the first magnetic sensor 30a, so the housing portion 31 becomes resistant to being poorly molded, as compared to when the detecting portion 300 of the first magnetic sensor 30a is arranged parallel to the opposite surface 314 of the housing portion 31 to the magnetic encoder 2. Specifically, as indicated by an arrow A in FIG. 4, during the resin molding of the housing portion 31, between the detecting portion 300 of the first magnetic sensor 30a and the mold 5, the resin flows from a wide side to a narrow side (in FIG. 4, from the right side to the left side) in the spacing between the detecting portion 300 of the first magnetic sensor 30a and the mold 5, and the resin is easily passed into the space between the detecting portion 300 of the first magnetic sensor 30a and the mold 5, so the housing portion 31 becomes resistant to being poorly molded. Note that, during the resin molding of the housing portion 31, both the magnetic sensors 30a and 30b may be set in the mold 5 while remaining held in a resin holder, which is not shown in FIG. 4, though.

Further, in the present embodiment, the respective capacitive element protecting portions 302 and 302 of the two magnetic sensors 30a and 30b are being provided in such a manner as to protrude toward opposite surface 314 sides of the respective one pairs of connection terminals 301 and 301, and 301 and 301 of the two magnetic sensors 30a and 30b, but, by arranging the first magnetic sensor 30a in such a manner as to be inclined with respect to the opposite surface 314 of the housing portion 31 to the magnetic encoder 2, even with the detecting portion 300 of the first magnetic sensor 30a being brought close to the opposite surface 314 of the housing portion 31 to the magnetic encoder 2, it is possible to prevent the capacitive element protecting portion 302 of the first magnetic sensor 30a from being exposed (protruded) from the housing portion 31.

If the spacing (the minimum distance) d between the detecting portion 300 of the first magnetic sensor 30a and the opposite surface 314 of the housing portion 31 to the magnetic encoder 2 is too small, there is concern that, even when the first magnetic sensor 30a is tilted, a poor molding may occur, so it is desirable to set the spacing d between the detecting portion 300 of the first magnetic sensor 30a and the opposite surface 314 of the housing portion 31 to the magnetic encoder 2 at not smaller than 0.5 mm. In the present embodiment, by making the spacing between the capacitive element protecting portion 302 of the first magnetic sensor 30a and the opposite surface 314 of the housing portion 31 to the magnetic encoder 2 substantially equal to the above-mentioned spacing d between the detecting portion 300 of the first magnetic sensor 30a and the opposite surface 314 of the housing portion 31 to the magnetic encoder 2, the resin is easily passed into the space between the capacitive element protecting portion 302 of the first magnetic sensor 30a and the mold 5 as well, so the housing portion 31 becomes more resistant to being poorly molded.

In addition, if the angle θ of the detecting portion 300 of the first magnetic sensor 30a with respect to the opposite surface 314 of the housing portion 31 to the magnetic encoder 2 is too small, the resin is poorly passed into the space between the detecting portion 300 of the first magnetic sensor 30a and the mold 5, so it is desirable to set the angle θ of the detecting portion 300 of the first magnetic sensor 30a with respect to the opposite surface 314 of the housing portion 31 to the magnetic encoder 2 at not smaller than 3 degrees. Further, if the angle θ of the detecting portion 300 of the first magnetic sensor 30a with respect to the opposite surface 314 of the housing portion 31 to the magnetic encoder 2 is too large, the sensing portion D of the magnetic detection element included in the detecting portion 300 of the first magnetic sensor 30a is increased in distance from the opposite surface 314 of the housing portion 31 to the magnetic encoder 2, leading to concern that its detection sensitivity may be lowered, so it is desirable to set the angle θ of the detecting portion 300 of the first magnetic sensor 30a with respect to the opposite surface 314 of the housing portion 31 to the magnetic encoder 2 at not larger than 10 degrees.

In the rotation detecting device 1, the magnetic detection element included in the detecting portion 300 of the first magnetic sensor 30a is configured to detect a magnetic field in a direction perpendicular (in FIG. 3B, the vertical direction, the direction of the long sides of the substantially rectangular plate shape detecting portion 300 of the first magnetic sensor 30a) to a thickness direction of the detecting portion 300 of the first magnetic sensor 30a and to the extending out direction of the two connection terminals 301 and 301 of the first magnetic sensor 30a. For that reason, even when the detecting portion 300 of the first magnetic sensor 30a is inclined with respect to the opposite surface 314 of the housing portion 31 to the magnetic encoder 2 (is inclined in the direction of the short sides of the substantially rectangular plate shape detecting portion 300 of the first magnetic sensor 30a), the direction of detection of the magnetic field in the magnetic detection element included in the detecting portion 300 of the first magnetic sensor 30a is kept parallel to the opposite surface 314 of the housing portion 31 to the magnetic encoder 2.

The detecting portion 300 of the first magnetic sensor 30a is configured in such a manner that the sensing portion D of the magnetic detection element included in the detecting portion 300 of the first magnetic sensor 30a is located closer to the opposite surface 314 of the housing portion 31 to the magnetic encoder 2 than to the middle in the thickness direction of the detecting portion 300 of the first magnetic sensor 30a. This makes it possible to bring the sensing portion D of the magnetic detection element included in the detecting portion 300 of the first magnetic sensor 30a closer to the opposite surface 314 of the housing portion 31 to the magnetic encoder 2, and therefore make the spacing between the sensing portion D of the magnetic detection element included in the detecting portion 300 of the first magnetic sensor 30a and the magnetic encoder 2 smaller to thereby be able to enhance the detection sensitivity of the magnetic detection element included in the detecting portion 300 of the first magnetic sensor 30a.

In addition, in the rotation detecting device 1, the second magnetic sensor 30b is arranged in such a manner that its detecting portion 300 is inclined with respect to the detecting portion 300 of the first magnetic sensor 30a. In the present embodiment, the inclination of the detecting portion 300 of the second magnetic sensor 30b with respect to the opposite surface 314 of the housing portion 31 to the magnetic encoder 2 is smaller than the inclination (the angle θ) of the detecting portion 300 of the first magnetic sensor 30a with respect to the opposite surface 314 of the housing portion 31 to the magnetic encoder 2. More specifically, in the present embodiment, the detecting portion 300 of the second magnetic sensor 30b is arranged parallel to the opposite surface 314 of the housing portion 31 to the magnetic encoder 2. The spacing between the respective detecting portions 300 and 300 of the two magnetic sensors 30a and 30b of the sensor section 3 is gradually being widened from the extending out side of the respective one pairs of connection terminals 301 and 301, and 301 and 301 of the two magnetic sensors 30a and 30b to the front end portion of the sensor section 3.

In addition, the second magnetic sensor 30b has bent portions 301a and 301a in the two connection terminals 301 and 301 respectively thereof. In the present embodiment, the bent portions 301a and 301a are being formed by bending the two connection terminals 301 and 301 of the second magnetic sensor 30b into a crank shape. As a result, even with the detecting portion 300 of the second magnetic sensor 30b being brought closer to the opposite surface 314 of the housing portion 31 to the magnetic encoder 2 (to the detecting portion 300 side of the first magnetic sensor 30a), it is possible to prevent the capacitive element protecting portion 302 of the second magnetic sensor 30b from interfering with the first magnetic sensor 30a.

Also, by forming the crank shape bent portions 301a and 301a in the two connection terminals 301 and 301 respectively of the second magnetic sensor 30b, it is possible to make the respective one end portions of the two connection terminals 301 and 301 of the second magnetic sensor 30b (the respective opposite end portions of the two connection terminals 301 and 301 to the detecting portion 300 of the second magnetic sensor 30b) parallel to the direction in which the cable 4 is extended out. This makes it possible to wire the respective central conductors 41a and 41a of the two electric wires 41 and 41 with no difficulty in bending, and facilitates the wiring layout thereof within the sensor section 3. In the present embodiment, the linear shape joint portions 411 and 411 are being provided in the respective one end portions of the respective central conductors 41a and 41a of the two electric wires 41 and 41 respectively, and respective one parts of the joint portions 411 and 411 are being configured to be protruded from the two connection terminals 301 and 301 of the second magnetic sensor 30b, so the lengths used for the respective central conductors 41a and 41a of the two electric wires 41 and 41 respectively to be freely bent are relatively short, but, by making the respective one end portions of the two connection terminals 301 and 301 parallel to the extending out direction of the cable 4, it is possible to wire the respective central conductors 41a and 41a of the two electric wires 41 and 41 with no difficulty.

(Modifications)

Although, in the present embodiment, the detecting portion 300 of the second magnetic sensor 30b is arranged in such a manner as to be inclined with respect to the detecting portion 300 of the first magnetic sensor 30a, the present invention is not limited to this, but may be configured in such a manner that the detecting portion 300 of the second magnetic sensor 30b is arranged parallel to the detecting portion 300 of the first magnetic sensor 30a. This makes it possible to bring the detecting portion 300 of the second magnetic sensor 30b closer to the opposite surface 314 of the housing portion 31 to the magnetic encoder 2, and therefore makes the spacing between the sensing portion D of the magnetic detection element included in the detecting portion 300 of the second magnetic sensor 30b and the magnetic encoder 2 smaller to thereby be able to enhance the detection sensitivity of the magnetic detection element of the second magnetic sensor 30b.

(Actions and Advantageous Effects of the Embodiment)

As described above, in the rotation detecting device 1 according to the present embodiment, of the two magnetic sensors 30 and 30 of the sensor section 3, the detecting portion 300 of the first magnetic sensor 30a being arranged in the side of the sensor section 3 close to the encoder 2 is arranged in such a manner as to be inclined with respect to the opposite surface 314 of the housing portion 31 to the magnetic encoder 2. This makes it possible to bring the detecting portion 300 of the first magnetic sensor 30a closer to the opposite surface 314 of the housing portion 31 to the magnetic encoder 2, and therefore makes the spacing between the sensing portion D of the magnetic detection element included in the detecting portion 300 of the first magnetic sensor 30a and the magnetic encoder 2 smaller to thereby be able to enhance the detection sensitivity of the magnetic detection element included in the detecting portion 300 of the first magnetic sensor 30a. In addition, in the resin molding of the housing portion 31, since the flow of the resin is improved, the housing portion 31 becomes resistant to being poorly molded, and so the occurrence of a lowering in the quality of the resin molding is suppressed.

SUMMARY OF THE EMBODIMENTS

Next, the technical ideas grasped from the above-described embodiments will be described with the aid of the reference characters and the like in the embodiments. It should be noted, however, that each of the reference characters and the like in the following descriptions is not to be construed as limiting the constituent elements in the claims to the members and the like specifically shown in the embodiments.

[1] A rotation detecting device (1), comprising: a member (2) to be detected being configured to be fitted to a rotatable member (11), and being provided with a plurality of magnetic poles along a circumferential direction centered on a rotation axis of the rotatable member (11); and a sensor section (3) being configured to be fitted to a fixed member (9) that is not rotated by rotation of the rotatable member (11), and being arranged opposite the member (2) to be detected, wherein the sensor section (3) includes: two magnetic sensors (30), each including a plate shape detecting portion (300) including a magnetic detection element, which is configured to detect a magnetic field produced from the member (2) to be detected, and a connection terminal (301), which is extended out from the detecting portion (300), with the detecting portions (300) of the two magnetic sensors (30) being arranged in such a manner as to overlap each other in an opposite arrangement direction of the sensor section (3) and the member (2) to be detected; and a housing portion (31) being made of a resin mold provided in such a manner as to cover the two magnetic sensors (30) together, and including an opposite surface (314) to the member (2) to be detected, wherein the two magnetic sensors (30) include a first magnetic sensor (30a), which is arranged in a side of the sensor section (3) close to the member (2) to be detected, with the detecting portion (300) of the first magnetic sensor (30a) being arranged in such a manner as to be inclined with respect to the opposite surface (314) of the housing portion (31) to the member (2) to be detected.

[2] The rotation detecting device (1) as defined in [1] above, wherein the detection portion (300) of the first magnetic sensor (30a) is arranged in such a manner as to be increased in distance from the opposite surface (314) of the housing portion (31), and toward a side from which the connection terminal (301) of the first magnetic sensor (30a) is extended out.

[3] The rotation detecting device (1) as defined in [2] above, wherein the magnetic detection element included in the detecting portion (300) is configured to detect a magnetic field in a direction perpendicular to a thickness direction of the detecting portion (300) and to a direction in which the connection terminal (301) is extended out from the detecting portion (300) of the first magnetic sensor (30a), with the detecting portion (300) of the first magnetic sensor (30a) being arranged in such a manner that a detection direction of the magnetic field in the magnetic detection element is parallel to the opposite surface (314) of the housing portion (31).

[4] The rotation detecting device (1) as defined in [1] or [2] above, wherein the detecting portion (300) of the first magnetic sensor (30a) is configured in such a manner that a sensing portion (D) of the magnetic detection element is located closer to the opposite surface (314) of the housing portion (31) than to a middle in a thickness direction of the detecting portion (300).

[5] The rotation detecting device (1) as defined in any one of [1] to [4] above, wherein the two magnetic sensors (30) include a second magnetic sensor (30b), which is arranged in a side of the sensor section (3) away from the member (2) to be detected, with the connection terminal (301) of the second magnetic sensor (30b) including a bent portion (301a) therein.

[6] The rotation detecting device (1) as defined in any one of [1] to [5] above, wherein the two magnetic sensors (30) include a second magnetic sensor (30b), which is arranged in a side of the sensor section (3) away from the member (2) to be detected, with the detecting portion (300) of the second magnetic sensor (30b) being arranged in such a manner as to be inclined with respect to the detecting portion (300) of the first magnetic sensor (30a).

[7] The rotation detecting device (1) as defined in [6] above, wherein an inclination of the detecting portion (300) of the second magnetic sensor (30b) with respect to the opposite surface (314) of the housing portion (31) is smaller than an inclination of the detecting portion (300) of the first magnetic sensor (30a) with respect to the opposite surface (314) of the housing portion (31).

[8] The rotation detecting device (1) as defined in [6] or [7] above, wherein the detecting portion (300) of the second magnetic sensor (30b) is arranged parallel to the opposite surface (314) of the housing portion (31).

[9] The rotation detecting device (1) as defined in any one of [1] to [5] above, wherein the two magnetic sensors (30) include a second magnetic sensor (30b), which is arranged in a side of the sensor section (3) away from the member (2) to be detected, with the detecting portion (300) of the second magnetic sensor (30b) being arranged parallel to the detecting portion (300) of the first magnetic sensor (30a).

Although the embodiments of the present invention have been described above, the embodiments described above are not to be construed as limiting the inventions according to the claims. In addition, it should be noted that not all the combinations of the features described in the embodiments are indispensable to the means for solving the problems of the invention.

The present invention can be appropriately modified and implemented without departing from the spirit thereof. For example, although, in the above-described embodiments, the case in which both the magnetic sensors 30a and 30b of the sensor section 3 are being configured to include their respective capacitive elements designed for noise suppression and their respective capacitive element protecting portions 302 and 302 has been described, those respective capacitive elements and those respective capacitive element protecting portions 302 and 302 can be omitted.

In addition, although, in the above-described embodiments, the two connection terminals 301 and 301 of the first magnetic sensor 30a are being configured in a linear shape, the shapes of the two connection terminals 301 and 301 of the first magnetic sensor 30a are not limited to the above shape, but the two connection terminals 301 and 301 of the first magnetic sensor 30a may each be configured to include a bent portion. This makes it possible to make the respective one end portions of the two connection terminals 301 and 301 (the opposite end portions of the two connection terminals 301 and 301 to the detecting portion 300) of the first magnetic sensor 30a parallel to the extending out direction of the cable 4, and thereby make the wiring layout capability within the sensor section 3 higher.

Further, although, in the above-described embodiments, the case in which the side surface of the front end portion of the sensor section 3 is formed as the opposite surface 314 of the housing portion 31 to the magnetic encoder 2 has been described, the present invention is not limited to this, but may be configured in such a manner that the front end face of the sensor section 3 is formed as the opposite surface 314 of the housing portion 31 to the magnetic encoder 2. In this case, the cable 4 is extended out in a direction parallel to the rotation axis line O of the inner race 11 of the wheel bearing device 10.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

has been described, the number of the power supply wires 2 and the number of the signal wires 3 are not limited to the above numbers. For example, when two of the signal wires 3 configured to be used for the ABS sensor and two of the signal wires 3 configured to be used for the air pressure sensor are included in the composite cable 1, the two signal wires 3 and 3 configured to be used for the ABS sensor may be configured to be provided adjacent to each other, while the two signal wires 3 and 3 configured to be used for the air pressure sensor may be configured to be provided adjacent to each other.

What is claimed is:
1. A rotation detecting device, comprising:
   a member to be detected being configured to be fitted to a rotatable member, and being provided with a plurality of magnetic poles along a circumferential direction centered on a rotation axis of the rotatable member; and
   a sensor section being configured to be fitted to a fixed member that is not rotated by rotation of the rotatable member, and being arranged opposite the member to be detected,
   wherein the sensor section includes:

two magnetic sensors, each including a plate shape detecting portion including a magnetic detection element, which is configured to detect a magnetic field produced from the member to be detected, and a connection terminal, which is extended out from the detecting portion, with the detecting portions of the two magnetic sensors being arranged in such a manner as to overlap each other in an opposite arrangement direction of the sensor section and the member to be detected; and a housing portion being made of a resin mold provided in such a manner as to cover the two magnetic sensors together, and including an opposite surface to the member to be detected, wherein the two magnetic sensors include a first magnetic sensor, which is arranged in a side of the sensor section close to the member to be detected, with the detecting portion of the first magnetic sensor being arranged in such a manner as to be inclined with respect to the opposite surface of the housing portion to the member to be detected;

wherein the detecting portion of the first magnetic sensor is arranged in such a manner as to be increased in distance from the opposite surface of the housing portion, and toward a side from which the connection terminal of the first magnetic sensor is extended out.

2. The rotation detecting device according to claim 1, wherein the magnetic detection element included in the detecting portion is configured to detect a magnetic field in a direction perpendicular to a thickness direction of the detecting portion and to a direction in which the connection terminal is extended out from the detecting portion of the first magnetic sensor, with the detecting portion of the first magnetic sensor being arranged in such a manner that a detection direction of the magnetic field in the magnetic detection element is parallel to the opposite surface of the housing portion.

3. The rotation detecting device according to claim 1, wherein the detecting portion of the first magnetic sensor is configured in such a manner that a sensing portion of the magnetic detection element is located closer to the opposite surface of the housing portion than to a middle in a thickness direction of the detecting portion.

4. The rotation detecting device according to claim 1, wherein the two magnetic sensors include a second magnetic sensor, which is arranged in a side of the sensor section away from the member to be detected, with the connection terminal of the second magnetic sensor including a bent portion therein.

5. The rotation detecting device according to claim 1, wherein the two magnetic sensors include a second magnetic sensor, which is arranged in a side of the sensor section away from the member to be detected, with the detecting portion of the second magnetic sensor being arranged parallel to the detecting portion of the first magnetic sensor.

6. A rotation detecting device, comprising:
a member to be detected being configured to be fitted to a rotatable member, and being provided with a plurality of magnetic poles along a circumferential direction centered on a rotation axis of the rotatable member; and
a sensor section being configured to be fitted to a fixed member that is not rotated by rotation of the rotatable member, and being arranged opposite the member to be detected,
wherein the sensor section includes:
two magnetic sensors, each including a plate shape detecting portion including a magnetic detection element, which is configured to detect a magnetic field produced from the member to be detected, and a connection terminal, which is extended out from the detecting portion, with the detecting portions of the two magnetic sensors being arranged in such a manner as to overlap each other in an opposite arrangement direction of the sensor section and the member to be detected; and
a housing portion being made of a resin mold provided in such a manner as to cover the two magnetic sensors together, and including an opposite surface to the member to be detected,
wherein the two magnetic sensors include a first magnetic sensor, which is arranged in a side of the sensor section close to the member to be detected, with the detecting portion of the first magnetic sensor being arranged in such a manner as to be inclined with respect to the opposite surface of the housing portion to the member to be detected,
wherein the two magnetic sensors include a second magnetic sensor, which is arranged in a side of the sensor section away from the member to be detected, with the detecting portion of the second magnetic sensor being arranged in such a manner as to be inclined with respect to the detecting portion of the first magnetic sensor.

7. The rotation detecting device according to claim 6, wherein an inclination of the detecting portion of the second magnetic sensor with respect to the opposite surface of the housing portion is smaller than an inclination of the detecting portion of the first magnetic sensor with respect to the opposite surface of the housing portion.

8. The rotation detecting device according to claim 6, wherein the detecting portion of the second magnetic sensor is arranged parallel to the opposite surface of the housing portion.

\* \* \* \* \*